(12) United States Patent
Halbert et al.

(10) Patent No.: US 6,990,036 B2
(45) Date of Patent: Jan. 24, 2006

(54) METHOD AND APPARATUS FOR MULTIPLE ROW CACHES PER BANK

(75) Inventors: John B. Halbert, Beaverton, OR (US); Robert M. Ellis, Hillsboro, OR (US); Kuljit S. Bains, Olympia, WA (US); Chris B. Freeman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/749,690

(22) Filed: Dec. 30, 2003

(65) Prior Publication Data

US 2005/0146974 A1 Jul. 7, 2005

Related U.S. Application Data

(63) Continuation-in-part of application No. 10/750,038, filed on Dec. 30, 2003.

(51) Int. Cl.
*G11C 7/00* (2006.01)
(52) U.S. Cl. .................. 365/230.03; 365/198
(58) Field of Classification Search .......... 365/230.03, 365/198
See application file for complete search history.

(56) References Cited

U.S. PATENT DOCUMENTS

| | | | |
|---|---|---|---|
| 4,608,666 A | 8/1986 | Uchida | |
| 4,817,054 A * | 3/1989 | Banerjee et al. | 365/189.02 |
| 5,404,331 A | 4/1995 | McClure | |
| 5,586,294 A | 12/1996 | Goodwin et al. | |
| 5,703,810 A * | 12/1997 | Nagy | 365/189.05 |
| 5,748,554 A * | 5/1998 | Barth et al. | 365/230.03 |
| 6,178,479 B1 | 1/2001 | Vishin | |
| 6,199,142 B1 * | 3/2001 | Saulsbury et al. | 711/118 |
| RE37,409 E * | 10/2001 | Barth et al. | 365/230.03 |
| 6,330,636 B1 | 12/2001 | Bondurant et al. | |
| 6,850,438 B2 * | 2/2005 | Lee et al. | 365/185.11 |

FOREIGN PATENT DOCUMENTS

| | | |
|---|---|---|
| EP | 0 463 617 A2 | 1/1992 |
| EP | 0 704 847 A1 | 4/1996 |
| WO | PCT/US2004/043672 | 4/2005 |

OTHER PUBLICATIONS

Katsumi Dosaka et al., "A 100-MHz 4-Mb Cache DRAM with Fast Copy-Back Scheme", IEEE Journal of Solid-State Circuits, vol. 27, No. 11, Nov. 1992, XP 000320439, pp. 1534-1538.

* cited by examiner

*Primary Examiner*—Michael Tran
(74) *Attorney, Agent, or Firm*—Blakely, Sokoloff, Taylor & Zafman LLP

(57) ABSTRACT

Provision and use of sets of isolators to enable the caching of the contents of at least one row of memory cells within a subarray of a bank of a memory device by a row of sense amplifiers associated with the subarray to enable faster access to write the data directed to at least one row through a write operation causing the data to written to the row of sense amplifiers versus from the row of memory cells, directly, and to store an indication that the data cached by the row of sense amplifiers is dirty.

20 Claims, 6 Drawing Sheets

ND APPARATUS FOR MULTIPLE
ROW CACHES PER BANK

CROSS-RELATED APPLICATION

The present application is a continuation-in-part of U.S. patent application Ser. No. 10/750,038, filed Dec. 30, 2003, entitled "Method and Apparatus for Multiple Row Caches Per Bank", and assigned to the corporate assignee of the present invention and incorporated herein by reference.

BACKGROUND

Dynamic random access memory (DRAM) devices provide the benefits of higher storage densities and less power consumption in comparison to other memory technologies, including and most notably, static random access memory (SRAM) devices. However, these benefits come at the cost of incurring various delays in accessing the memory cells making up a DRAM device, both at regular intervals, and in the time periods immediately before and after each access to either read data from the memory cells or to write data to the memory cells.

As is well known to those skilled in the art, these myriad delays arise from the dynamic nature of the storage of data that gives DRAM devices their name. Each memory cell is made up of transistors configured to function very much like a capacitor that stores the binary 0 or 1 representing a bit of data as a charge. This capacitor-like configuration of transistors requires fewer transistors and less power than does a memory cell of a SRAM device, making possible the higher densities and lower power consumption of DRAM devices. However, this same capacitor-like configuration of transistors leaks the charge over time, allowing the charge to decay over time, and resulting in the need to carry out refresh operations to restore the charge at regular intervals. This same capacitor-like configuration also entirely loses its charge (i.e., literally discharges) when the charge representing the binary 0 or 1 is read from the memory cell, thereby requiring subsequent operations to be carried out to restore the charge representing the binary 0 or 1 that was just read. Furthermore, due to the minute amplitude and transitory lifespan of the discharged charges received from the memory cells when the binary 0 or 1 values are read, sense amplifiers are needed to both amplify and latch the discharged charges received from the memory cells. This same minute amplitude also requires that the conductors carrying the discharged charges from the memory cells to corresponding sense amplifiers be precharged to a voltage level that will not mask or overwhelm the discharged charges such that the sense amplifiers are prevented from accurately receiving and latching the binary 0 and 1 values read from the memory cells.

It is the refresh operations to maintain the charge stored in each memory cell, the operations to restore charges lost in discharging for a read operation, and the operations to precharge conductors for carrying the discharged charges, as well as other maintenance operations, that impose the various delays that are suffered as a result of employing DRAM technology. These delays have the effect of limiting the rate at which data may be written to or read from DRAM devices, and although components such as processors have made great strides in becoming ever faster, comparatively little progress has been made in increasing the rate of reading data from and writing data to these capacitor-like memory cells.

Various techniques have been devised to "hide" this growing disparity in speed between processors and DRAM memory devices, including the use of SRAM devices as caches and interleaving accesses made to different DRAM devices out of a grouping of multiple DRAM devices. However, the addition of SRAM devices to serve as a cache frequently adds many more components (thereby increasing costs) and a considerable increase in the amount of power used. Also, the interleaving of accesses to multiple DRAM devices adds considerable complexity and often a need for wider memory buses to a memory system made up of DRAM devices. Some other way of counteracting the effects of the disparity in speed between processors and DRAM devices that does not suffer these drawbacks would be desirable.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

Although the following discussion centers on DRAM devices in which memory cells are organized into one or more two dimensional arrays of rows and columns, it will be understood by those skilled in the art that the invention as hereinafter claimed may be practiced in support of any type of memory device having memory cells organized in any of a number of ways, including interleaved banks, arrays of more than two dimensions (i.e., more than two-part addresses), content-addressable, etc. Also, although at least part of the following discussion centers on memory devices within computer systems, it will be understood by those skilled in the art that the invention as hereinafter claimed may be practiced in connection with other electronic devices having memory devices.

Figure 1:
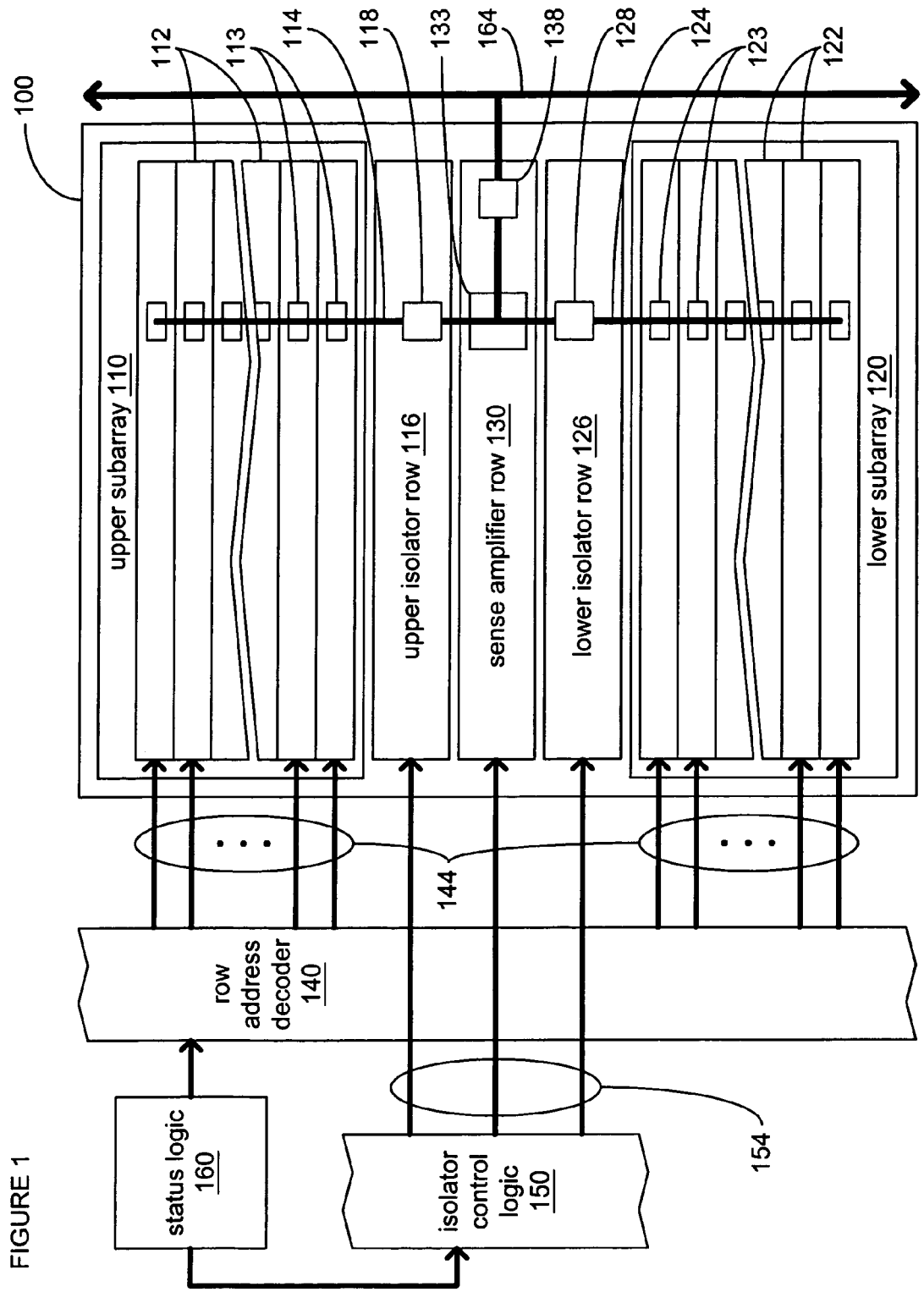
FIG. 1 is a block diagram of an embodiment employing a block of memory cells.

FIG. 1 is a simplified block diagram of one embodiment employing a block of memory. Block of memory 100 is made up, at least in part, of upper subarray 110, upper isolator row 116, lower subarray 120, lower isolator row 126 and sense amplifier row 130. Block of memory 100 is one of a multitude of blocks of memory making up an array of memory within a memory device. In turn, in various embodiments, such a memory device may have more than one of such arrays such that each of these arrays becomes one of a multitude of banks within the memory device.

Both upper subarray 110 and lower subarray 120 are made up of rows 112 and 122, respectively, of memory cells (such as memory cells 113 and 123), and each of these memory cells stores a charge representing a single binary 0 or 1 bit value of data. Memory cells 113 of upper subarray 110 and memory cells 123 of lower subarray 120 make up a single one of many columns of memory cells spanning across rows 112 of upper subarray 110 and rows 122 of lower subarray 120. Each memory cell within each column of memory cells in upper subarray 110 are coupled to a common bit line for that column in upper subarray 110, such as bit line 114, and correspondingly, each memory cell within each column of memory cells in lower subarray 120 are coupled to a common bit line for that column in lower subarray 120, such as bit line 124. Each bit line within upper subarray 110 (such as bit line 114) and each corresponding bit line within lower subarray 120 (such as bit line 124) are both selectively coupled to a corresponding sense amplifier within sense amplifier row 130 (such as sense amplifier 133) while also being kept electrically isolated from each other by corresponding isolators within isolator rows 116 and 126, respectively (such as isolators 118 and 128). Furthermore, each of the sense amplifiers of sense amplifier row 130 (such as sense amplifier 133) is selectively coupled via a corresponding isolator (such as isolator 138) to a global I/O line (such as global I/O line 164) used to couple together corresponding sense amplifiers with their counterparts in other blocks of memory that also make up the array of memory of which block of memory 100 is a part.

Each one of rows 112 and 122 is individually coupled to row address decoder 140 via a separate one of word lines 144. Through word lines 144, row address decoder may select a single one of the rows out of rows 112 and 122 to be accessed. Isolators within upper isolator row 116, lower isolator row 126 and sense amplifier row 130, such as isolators 118, 128 and 138, respectively, are coupled via separate ones of isolator control lines 154 to isolator control logic 150. Isolator control logic 150 coordinates the use of isolators within upper isolator row 116 and lower isolator row 126 to selectively couple the sense amplifiers of row 130 to one or the other of the bit lines for the columns of memory cells within either upper subarray 110 or lower subarray 120 when a row of memory cells in one or the other of upper subarray 110 or lower subarray 120 is selected through row address decoder 140 to be accessed. At other times, isolator control logic coordinates the use of isolators within upper isolator row 116 and lower isolator row 126 to isolate the sense amplifiers of row 130 from one or both of the bit lines of upper subarray 110 and lower subarray 120 to ensure that data latched within the sense amplifiers from one accessed row is not altered when those bit lines are precharged in preparation for accessing to another row of memory cells. Isolator control logic 150 also coordinates the use of isolators that selectively couple the sense amplifiers of sense amplifier row 130 to the global I/O lines.

In some embodiments, both row address decoder 140 and isolator control logic 150 are further coupled to status logic 160. Status control logic 160 stores information concerning which one row out of either rows 112 and 122 is the row from which data was copied into the sense amplifiers of sense amplifier row 130, thereby allowing coordination between the use of row address decoder 140 and isolator control logic 150 to make use of occasions when data from a specific row has been copied into the sense amplifiers of sense amplifier row 130 to speed up accesses to that data. This coordination between the capabilities of isolator control logic 150 to control various isolators, the capabilities of row address decoder 140 to select and control access to any given row, and the capabilities of status control logic 160 to track what data has been latched by the sense amplifiers of sense amplifier row 130 may be employed to operate, and selectively isolate/couple the sense amplifiers of sense amplifier row 130 in such a way as to allow the sense amplifiers of sense amplifier row 130 to serve as a form of row-wide cache of data read from one of the rows of memory cells within either upper subarray 110 or lower subarray 120. These various capabilities of row address decoder 140, isolator control logic 150 and status logic 160 may also be employed to attempt to hide (and thereby, avoid incurring) time delays imposed by such operations as a precharge to close a row from which data has been copied to the sense amplifiers of sense amplifier row 130 while simultaneously allowing read operations and/or other operations involving that data to occur. With each block of memory (such as block of memory 100) that makes up an array within a memory device having a row of sense amplifiers that is employed in such a manner, a large memory device having numerous blocks of memory could be provided with a form of row-wide cache system of considerable size.

In a memory read operation where data from a row within either upper subarray 110 or lower subarray 120 is requested and where the contents of that row are not already currently latched within the sense amplifiers of sense amplifier row 130 (perhaps as indicated by status logic 160), row address decoder 140 activates an appropriate one of word lines 144 to select the row within either upper subarray 110 or lower subarray 120 that is to be read. The memory cells of the selected row are thereby caused to discharge the charges held within those memory cells either onto the bit lines coupling upper subarray 110 to upper isolator row 116 (if the selected row is within upper subarray 110), or onto the bit lines coupling lower subarray 120 to lower isolator row 126 (if the selected row is within lower subarray 120). Also, isolator control logic 150 operates an appropriate one of isolator control lines 154 to cause either the isolators within upper isolator row 116 or lower isolator row 126 (again, depending on whether the selected row is within upper subarray 110 or lower subarray 120) to couple the sense amplifiers of sense amplifier row 130 to the bit lines onto which the charges from the memory cells of the selected row are discharged. During this time, the isolators in the other one of either upper isolator row 116 or lower isolator row 126 are operated to isolate the sense amplifiers of sense amplifier row 130 from the bit lines of whichever one of upper subarray 110 or lower subarray 120 is the subarray in which the selected row is not located in order to avoid unnecessarily subjecting the sense amplifiers to the extra capacitive load of being coupled to bit lines that are not used to the transfer of the charges from the memory cells of the selected row. The sense amplifiers of sense amplifier row 130 receive and latch the discharged charges from the memory cells of the selected row, thereby latching the data that was stored in the memory cells of the selected row. Isolator control logic 150 further operates the appropriate one of isolator control lines 154 for the isolators within sense amplifier row 130 to couple the sense amplifiers of sense amplifier row 130 to corresponding global I/O lines, thereby allowing the data latched in the sense amplifiers of sense amplifier row 130 to be output by the memory device.

In a memory read operation where data from a row within either upper subarray 110 or lower subarray 120 is requested and where the contents of that row are already currently latched within the sense amplifiers of sense amplifier row 130 (perhaps as indicated by status logic 160), the delay of waiting for data to be transferred from the requested row across corresponding bit lines to the sense amplifiers of sense amplifier row 130 can be entirely avoided. Isolator control logic 150 operates the appropriate one of isolator control lines 154 to cause the isolators within sense amplifier row 130 to couple the sense amplifiers of sense amplifier row 130 to corresponding global I/O lines, thereby allowing the data latched in the sense amplifiers of sense amplifier row 130 to be output by the memory device.

Furthermore, following a memory read operation where data is requested from a row having contents that have not already been latched within the sense amplifiers of sense amplifier row 130 such that data had to be transferred from that row to those sense amplifiers before the data could be output by the memory device, the row just read may be closed with a precharge operation. During the precharge operation, the bit lines used to transfer the contents of the memory cells of that row to the sense amplifiers may be isolated from those sense amplifiers via the isolators of either upper isolator row 116 or lower isolator row 126 (depending on whether the row being closed by the precharge operation is within upper subarray 110 or lower subarray 120) so that the data latched by those sense amplifiers is not lost. Taking advantage of this ability to carry out the precharging of the bit lines coupled to a row from which data was just copied (thereby closing that row) while accesses to that data from the sense amplifiers continue to take place and before another row within block of memory 100 is selected for access (in other words, carrying out a preemptive precharge) may be deemed desirable so that when a new row from within block of memory 100 is later selected, there will be no need to wait for the precharge operation to be carried out before the new row can be accessed. Such a situation where the delay of a precharge operation must be incurred to close one row before a new row can be accessed is commonly called a "page miss" as a way of referring to having the "wrong" row still open when an access to a new page is to be made. In other words, the use of isolators described, above, permits at least some precharge operations and operations to access data to occur in parallel, and thereby affords a way to avoid incurring some page miss time penalties. By making use of such preemptive precharging, the lesser delay from activating the new row may frequently become the longest remaining delay that must be incurred (a situation that is commonly called a "page empty" as a way of referring to there being no rows still open).

In an example memory write operation to a given row within upper subarray 110, where the given row is the currently open row of the bank of which block of memory 100 is a part and the contents of the given row have already been copied to the sense amplifiers within sense amplifier row 130 (both conditions perhaps indicated by status logic 160), the write operation may be carried out without being preceded by a row activate operation to open the given row. Isolator control logic 150 may operate the isolators within sense amplifier row 130 to couple the sense amplifiers of sense amplifier row 130 to corresponding ones of global I/O lines 164 to latch the data received from the write operation. Isolator control logic 150 may also operate the isolators within upper isolator row 116 to couple bit lines within upper subarray 110 (such as bit line 114) to the sense amplifiers of sense amplifier row 130, and row address decoder 140 may operate the one word line of word lines 144 that corresponds to the given row, to cause the data received from the write operation to also be written to the memory cells of the given row across those bit lines. Where data received from the write operation is also copied to the memory cells of the given row, as well as being latched by the sense amplifiers within sense amplifiers row 130, the contents of both those memory cells and those sense amplifiers are kept coherent with each other, as a result. In contrast, where data received from the write operation is not also copied to the memory cells of the given row, the contents of those memory cells and the contents of the sense amplifiers within sense amplifier row 130 cease to be coherent, because the contents of those sense amplifiers are now more up to date than the contents of those memory cells. An advantage afforded by storing the data from the write operation only in those sense amplifiers is that less time is required for the data to be stored solely within those sense amplifiers than to also store the data within those memory cells, i.e., a form of "mini write" operation with overall timings shorter than required for a write operation that includes storing data within those memory cells. However a disadvantage arising from storing that data only in those sense amplifiers is that the cache-like function performed by those sense amplifiers means that those sense amplifiers can provide only temporary storage and that the more up to date contents of those sense amplifiers will eventually have to be copied from those sense amplifiers and into those memory cells to prevent the more up to date contents of those sense amplifiers from being lost.

In other words, where data received from a write operation is stored only in the sense amplifiers within sense amplifier row 130, and not also within the memory cells of the row to which the write operation is directed, that data may be described as having been "posted" in the sense amplifiers as well as causing the contents of the sense amplifiers to become describable as being "dirty" as a result of being more up to date than the contents of the memory cells of the row to which the write operation was directed, and a "writeback" operation will eventually have to be performed to copy the dirty contents posted within the sense amplifiers into the memory cells of the row to which the write operation was directed. In contrast, where such data is received from such a write operation and is stored within both sense amplifiers and memory cells of the row to which the write operation is directed, this behavior resulting in coherency of the contents of the sense amplifiers and the memory cells, a form of "write-through" updating of those memory cells can be said to have taken place during the carrying out of the write operation.

In another example memory write operation to a given row within upper subarray 110, where the given row is not the currently open row of the bank of which block of memory 100 is a part, but the contents of the given row have already been copied to the sense amplifiers within sense amplifier row 130 (both conditions perhaps indicated by status logic 160), the write operation may be preceded with a mini row activate command. That mini row activate command may be used to change the setting of row address decoder 140 so that the given row will now be the open one, but without necessarily preparing the memory cells of the given row to be accessed, thereby avoiding incurring the extra delay to allow such preparation of memory cells to take place. Isolator control logic 150 may operate the isolators within sense amplifier row 130 to couple the sense amplifiers of sense amplifier row 130 to corresponding ones of global I/O lines 164 to latch the data received from the write operation. Isolator control logic 150 may also operate the isolators within upper isolator row 116 to couple bit lines within upper subarray 110 (such as bit line 114) to the sense amplifiers of sense amplifier row 130, and row address decoder 140 may operate the one word line of word lines 144 that corresponds to the given row, to cause the data received from the write operation to also be written to the memory cells of the given row across those bit lines, thereby maintaining coherency between the contents of those sense amplifiers and those memory cells. Alternatively, if a mini write operation is carried out where the data received from the write operation is stored only in those sense amplifiers and not in those memory cells, then the contents of those sense amplifiers become dirty and a writeback operation to those memory cells will eventually be necessary to preserve the dirty contents.

In yet another example memory write operation to a given row within upper subarray 10, where the given row is not the currently open row of the bank of which block of memory 100 is a part, and the contents of the given row have not already been copied to the sense amplifiers within sense amplifier row 130 (both conditions perhaps indicated by status logic 160), the write operation may be preceded with a row activate command. That row activate command may be used both to change the setting of row address decoder 140 so that the given row will now be the open one, and to prepare the memory cells of the given row to be accessed. Isolator control logic 150 may operate the isolators within sense amplifier row 130 to couple the sense amplifiers of sense amplifier row 130 to corresponding ones of global I/O lines 164 to latch the data received from the write operation. Isolator control logic 150 may also operate the isolators within upper isolator row 116 to couple bit lines within upper subarray 110 to the sense amplifiers of sense amplifier row 130, and row address decoder 140 may operate the one word line of word lines 144 that corresponds to the given row, to cause the data received from the write operation to also be written to the memory cells of the given row across those bit lines in a write-through manner. Alternatively, if a mini write operation is carried out, then the contents of those sense amplifiers become dirty and a writeback operation to those memory cells will eventually be necessary to preserve the dirty contents.

For writeback operations to be carried out when needed, current information pertaining to whether the contents of the sense amplifiers of sense amplifier row 130 are dirty or not must be maintained, and in some embodiments, that information may be maintained within status logic 160, possibly alongside information concerning which row from either upper subarray 110 and lower subarray 120 has contents that have been copied into the sense amplifiers of sense amplifier row 130. In some embodiments, the timing of when a writeback operation takes place may be controlled by logic within the memory device of which block of memory 100 is a part, perhaps based on an algorithm that seeks to determine when block of memory 100 will not be accessed for a period of time long enough for the writeback operation to be carried out. Alternatively, the occurrence of a writeback operation may be controlled by logic external to the memory device, such as a memory controller. Furthermore, writeback operations may occasionally be necessitated by the need to remove dirty contents for one row from the sense amplifiers of sense amplifier row 130 to make the sense amplifiers available for latching the contents of another row.

The provision of the isolators in sense amplifier row 130 to selectively couple the sense amplifiers of sense amplifier row 130 to global I/O lines allows the sense amplifiers of sense amplifier row 130 to be isolated from their corresponding global I/O lines while sense amplifiers within another block of memory are coupled to the global I/O lines, and either transmit data latched within those sense amplifiers onto the global I/O lines, or latch received data into those sense amplifiers from the global I/O lines, all without causing the data latched within the sense amplifiers of sense amplifier row 130 to be lost. This use of isolators selectively coupling the sense amplifiers in both block of memory 100 and in other blocks of memory allows each block of memory to latch a copy of the contents of the row most recently read within each block of memory in a row of sense amplifiers, thereby providing speedier access to that data for being read and output by the memory device.

Although the discussion and depiction of bit lines in FIG. 1 may suggest the use of only a single bit line per column of memory cells, those skilled in the art will readily recognize that this same discussion and depiction of bit lines may also be applied to embodiments in which pairs of bit lines are employed for columns of memory cells to support differential signaling such that a bit of data and its compliment are transferred across pairs of bit lines between a memory cell and other components. Also, to ensure clarity, it should be noted that the specific depiction of memory cells 113 and 123, bit lines 114 and 124, isolators 118 and 128, sense amplifier 133 and isolator 138 are specifically depicted in FIG. 1 to provide an example of an embodiment of an assemblage of components making up a single column of storage within upper subarray 110 and lower subarray 120 within block of memory 100. This depiction of components of a single column should in no way be construed to suggest that block of memory 100 has only one column, as any reasonable embodiment shall have multiple columns, and therefore, the example assemblage of components would be replicated many times to provide a multitude of columns.

Although the discussion and depiction of block of memory 100 centers on a configuration in which both an upper and lower subarray are present, those skilled in the art will readily recognize that various other possible embodiments of a block of memory may employ only one subarray or more than two subarrays. Also, for the sake of clarity it should be explained that the use of the terms "upper" and "lower" is done only in recognition of the common practice among those skilled in the art of using the terms "upper" and "lower" to distinguish between two subarrays in discussing implementations of blocks of memory in which two subarrays are present. The terms "upper" and "lower" should not be taken as denoting any form of relative physical location or orientation of the two subarrays depicted in FIG. 1. In other words, this use of the terms "upper" and "lower" is meant to accomplish nothing more than would the use of terms such as "first" and "second" in distinguishing between two subarrays.

In various possible embodiments, upper subarray 110 may be made up of a quantity of 256 of rows 112, and lower subarray 120 would be made up of a quantity of 256 of rows 122. In such embodiments, a quantity of 32 of blocks of memory, such as block of memory 100, would make up each bank of memory in a memory device, and the memory device would be made up of 8 such banks of memory. However, as those skilled in the art will readily recognize, various differing quantities of rows per subarray, subarrays per block of memory, blocks of memory per bank, and banks per memory device may be employed without departing from the spirit and scope of the invention as hereinafter claimed.

In various possible embodiments, the isolators within sense amplifier row 130, such as isolator 138, may be implemented as logical OR gate devices. However, as those skilled in the art will readily recognize, the various isolators coupled to sense amplifiers within sense amplifier row 130 may be implemented with any number of possible logical gate circuits or other electronic circuits without departing from the spirit and scope of the invention as hereinafter claimed.

Figure 2:
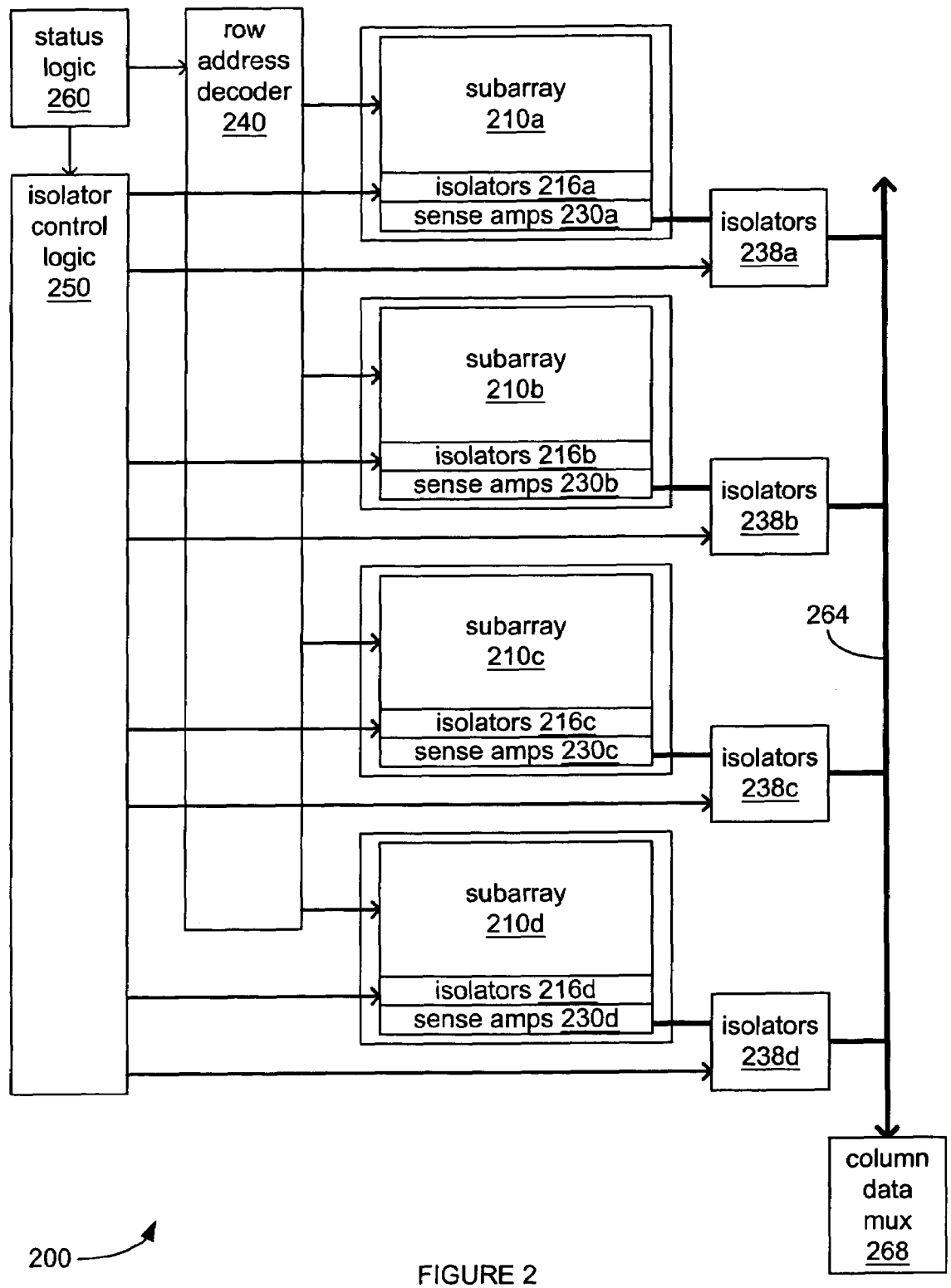
FIG. 2 is a block diagram of an embodiment employing a bank of memory cells arranged into multiple blocks of memory cells.

FIG. 2 is a simplified block diagram of one embodiment employing a bank of memory. Bank 200 is a bank of memory made up, at least in part, of subarrays 210a–d with corresponding sense amplifiers 230a–d and isolators 216a–d, isolators 238a–d, global I/O lines 264 and column data multiplexer 268. Bank 200 is one of a multitude of banks of memory making up a memory device. Those skilled in the art of the design of memory devices will readily recognize that FIG. 2 depicts one form of a relatively simple bank of memory, and that alternate embodiments are possible in which the exact arrangement and configuration of components may be reduced, augmented or otherwise altered without departing from the spirit and scope of the present invention as hereinafter claimed. For example, although for the sake of simplicity of discussion, bank 200 is depicted as having only four memory subarrays and each of those subarrays does not share a row of sense amplifiers with another subarray (as was depicted in FIG. 1), it will be readily understood by those skilled in the art that other possible embodiments of bank 200 may be made up of differing numbers of banks and/or the rows of isolators may be shared by two or more subarrays.

Subarrays 210a–d are each made up of memory cells organized into rows and columns. Each column of memory cells in subarrays 210a–d is coupled to a bit line for that column, and each of these bit lines may be selectively coupled to corresponding ones of sense amplifiers 230a–d through corresponding ones of isolators 216a–d. Furthermore, each of sense amplifiers 230a–d is selectively coupled via corresponding ones of isolators 238a–d to corresponding ones of global I/O lines 264. In turn, sense amplifiers 230a–d are coupled through the combination of corresponding isolators 238a–d and global I/O lines 264 to column data multiplexer 268. Column data multiplexer 268 is employed to select which one or ones of global I/O lines 264 are selectively coupled to other logic outside the memory device of which bank 200 is a part to allow data to be either output by or input to the selected ones of global I/O lines 264.

Rows of memory cells within each of subarrays 210a–d are individually coupled via word lines to row address decoder 240, operates those word lines to select a single row within each of subarrays 210a–d to be accessed. Isolators 216a–d are individually coupled to isolator control logic 250, which at various times, operates isolators 216a–d to selectively couple corresponding ones of sense amplifiers 230a–d to the bit lines of corresponding ones of subarrays 210a–d. At other times, isolator control logic operates one or more of isolators 216a–d to isolate corresponding ones of sense amplifiers 230a–d from corresponding bit lines for each column of memory cells within one or more of subarrays 210a–d when those bit lines are precharged to ensure that data latched within sense amplifiers 216a–d is not altered by a precharge operation. Isolator control logic 250 also operates isolators 238a–d to selectively couple sense amplifiers 230a–d to corresponding ones of global I/O lines 264.

In some embodiments, both row address decoder 240 and isolator control logic 250 are further coupled to status logic 260. Status control logic 260 stores information concerning which row in each of subarrays 210a–d is the row from which data was copied into corresponding ones of sense amplifiers 230a–d, thereby allowing coordination between the use of row address decoder 240 and isolator control logic 250 to make use of occasions when data from a specific row in each of subarrays 210a–d has been copied into sense amplifiers 230a–d to speed up accesses to that data. This coordination between the capabilities of isolator control logic 250 to control various isolators, the capabilities of row address decoder 240 to select and control access to any given row, and the capabilities of status control logic 260 to track what data has been latched by each of sense amplifiers 230a–d may be employed to operate, and selectively isolate/couple each of sense amplifiers 230a–d in such a way as to allow each of sense amplifiers 230a–d to serve as a form of row-wide cache of data read from one of the rows of memory cells within each of subarrays 210a–d. These various capabilities of row address decoder 240, isolator control logic 250 and status logic 260 may also be employed to attempt to hide (and thereby, avoid incurring) time delays imposed by such operations as a precharge to close a row in any one of subarrays 210a–d from which data has been copied to a corresponding one of sense amplifiers 230a–d while simultaneously allowing read operations and/or other operations involving that data to occur. With numerous sets of sense amplifiers (each corresponding to a single subarray, in the case of bank 200), a large memory device having multiple ones of bank 200 could be provided with a form of row-wide cache system of considerable size.

For example, in a memory read operation where data from a row within subarray 210a is requested and where the contents of that row are not already currently latched within the sense amplifiers 230a (perhaps as indicated by status logic 260), row address decoder 240 selects the desired row within subarray 210a. During this time, isolator control logic 250 causes isolators 216a to couple sense amplifiers 230a to bit lines coupled to the memory cells of the selected row. The memory cells of the selected row discharge the charges stored within those memory cells onto those bit lines. Sense amplifiers 230a receive and latch the discharged charges from the memory cells of the selected row, thereby latching the data that was stored in the memory cells of the selected row. Isolator control logic 250 further causes isolators 238a to couple sense amplifiers 230a to global I/O lines 264, thereby allowing the data latched by sense amplifiers 230a to be transmitted across global I/O lines 264 to column data multiplexer 268, at which a subset of the data transmitted to multiplexer 268 is selected and output by the memory device.

Also for example, in a memory read operation from a row within subarray 210a where the contents of that row are already currently latched within sense amplifiers 230a (perhaps as indicated by status logic 260), the delay of waiting for data to be transferred from the requested row to sense amplifiers 230a can be entirely avoided. Isolator control logic 250 operates isolators 238a to couple sense amplifiers 230a to global I/O lines 264, thereby allowing the data latched within sense amplifiers 230a to be transmitted across global I/O lines 264 to column data multiplexer 268, at which a subset of the data transmitted to multiplexer 268 is selected and output by the memory device.

Furthermore, following a memory read operation where, for example, data is requested from a row within subarray 210a that had contents that hadn't not already been latched by sense amplifiers 230a such that data had to be transferred from that row to sense amplifiers 230a before the data could be output by the memory device of which bank 200 is a part, the row just read may be closed with a precharge operation. During the precharge operation, the bit lines used to transfer the contents of the memory cells of that row to sense amplifiers 230a may be isolated from those sense amplifiers via isolators 216a so that the data just latched by sense amplifiers 216a is not lost. Taking advantage of this ability to carry out a preemptive precharge of the bit lines coupled to a row from which data was just copied while accesses to that data from sense amplifiers 230a continue to take place and before another row within subarray 210a is selected for access may be deemed desirable to avoid incurring the delay associated with a page miss. Thus, precharge operations and operations to access data are able to occur in parallel, and a possible instance of a page miss is converted into a page empty.

In an example memory write operation to a given row within subarray 210a where the given row is the currently open row of bank 200 and the contents of the given row have already been copied to sense amplifiers 230a (both conditions perhaps indicated by status logic 260), the write operation may be carried out without being preceded by a row activate operation to open the given row. Isolator control logic 250 may operate isolators 238a couple sense amplifiers 230a to corresponding ones of global I/O lines 264 to latch the data received from the write operation. Isolator control logic 250 may also operate isolators 216a to couple bit lines within subarray 210a to sense amplifiers 230a, and row address decoder 240 may operate the word line that corresponds to the given row, to cause the data received from the write operation to also be written to the memory cells of the given row across those bit lines to maintain coherency. In contrast, where data received from the write operation is not also copied to the memory cells of the given row, the contents of those memory cells and the contents of sense amplifiers 230a cease to be coherent and a writeback operation will eventually have to be carried out to copy the contents of sense amplifiers 230a to those memory cells, but the overall timing of the write operation may be reduced, providing an opportunity to carry out a mini write operation with shorter overall timings, instead.

In another example memory write operation to a given row within subarray 210a where the given row is not the currently open row bank 200, but the contents of the given row have already been copied to sense amplifiers 230a (both conditions perhaps indicated by status logic 260), the write operation may be preceded with a mini row activate command. That mini row activate command may be used to change the setting of row address decoder 240 so that the given row will become the open row, but without necessarily preparing the memory cells of the given row to be accessed, thereby avoiding incurring the extra delay to allow such preparation of memory cells to take place. Isolator logic 250 may operate isolators 238a to couple sense amplifiers 230a to corresponding ones of global I/O lines 264 to latch the data received from the write operation. Isolator control logic 250 may also operate isolators 216a to couple bit lines within subarray 210a to the sense amplifiers 230a, and row address decoder 240 may operate the word line that corresponds to the given row, to cause the data received from the write operation to also be written to the memory cells of the given row across those bit lines, thereby maintaining coherency between the contents of sense amplifiers 230a and those memory cells. Alternatively, if a mini write operation is carried out where the data received from the write operation is stored only in sense amplifiers 230a and not in those memory cells, then the contents of sense amplifiers 230a become dirty and a writeback operation to those memory cells will eventually be necessary to preserve the dirty contents of sense amplifiers 230a.

In yet another example memory write operation to a given row within subarray 210a, where the given row is not the currently open row of bank 200, and the contents of the given row have not already been copied to sense amplifiers 230a (both conditions perhaps indicated by status logic 260), the write operation may be preceded with a row activate command. That row activate command may be used both to change the setting of row address decoder 240 so that the given row will become the open row within bank 200, and to prepare the memory cells of the given row to be accessed. Isolator logic 250 may operate the isolators 238a to couple sense amplifiers 230a to corresponding ones of global I/O lines 264 to latch the data received from the write operation. Isolator control logic 250 may also operate isolators 216a to couple bit lines within subarray 210a to sense amplifiers 230a, and row address decoder 240 may operate the word line that corresponds to the given row, to cause the data received from the write operation to also be written to the memory cells of the given row across those bit lines in a write-through manner. Alternatively, if a mini write operation is carried out such that the data from the write operation is not also stored in those memory cells, then the contents of those sense amplifiers become dirty and a writeback operation to those memory cells will eventually be necessary to preserve the dirty contents.

For writeback operations to be carried out when needed, current information pertaining to whether the contents of sense amplifiers 230a–d are dirty or not must be maintained, and in some embodiments, that information may be maintained within status logic 260, possibly alongside information concerning which row from each of subarrays 210a–d has contents that have been copied into corresponding ones of sense amplifiers 230a–d. In some embodiments, the timing of when a writeback operation takes place may be controlled by logic within the memory device of which bank 200 is a part, perhaps based on an algorithm that seeks to determine when either all of bank 200 or whichever one of subarrays 210a–d has a row needing to be put through a writeback operation will not be accessed for a period of time long enough for the writeback operation to be carried out. Alternatively, the occurrence of a writeback operation may be controlled by logic external to the memory device, such as a memory controller. Furthermore, writeback operations may occasionally be necessitated by the need to remove dirty contents for one row from one of sense amplifiers 230a–d to make those sense amplifiers available for latching the contents of another row.

Figure 3:
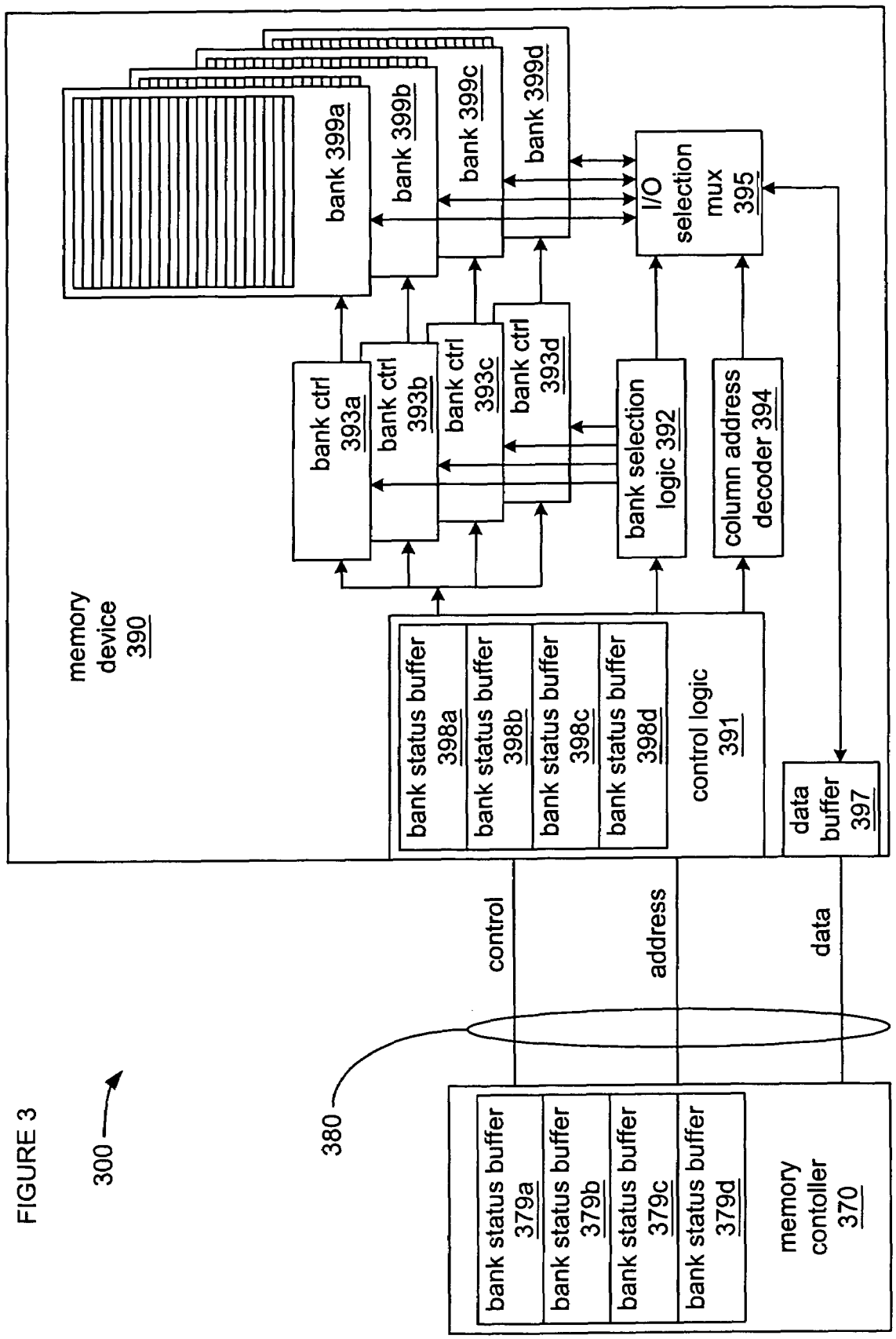
FIG. 3 is a block diagram of an embodiment employing a memory system.

FIG. 3 is a simplified block diagram of one embodiment employing a memory system. Memory system 300 is made up, at least in part, of memory controller 370 and memory device 390 coupled together via memory bus 380. Those skilled in the art of the design of memory systems will readily recognize that FIG. 3 depicts one form of a relatively simple memory system, and that alternate embodiments are possible in which the exact arrangement and configuration of components may be reduced, augmented or otherwise altered without departing from the spirit and scope of the present invention as hereinafter claimed. For example, although memory system 300 is depicted as having only one memory bus 380 and only one memory device 390 for the sake of simplicity in the discussion that follows, it will be readily understood by those skilled in the art that other possible embodiments of memory system 300 may be made up of multiple memory buses and/or devices.

Memory controller 370 controls the functions carried out by memory device 390 as part of providing access to memory device 390 to external devices (not shown) coupled to memory controller 370. Specifically, an external device coupled to memory controller 370 issues commands to memory controller 370 to store data within memory device 390, and to retrieve stored data from memory device 390. Memory controller 370 receives these commands and relays them to memory device 390 in a format having timing and protocols compatible with memory bus 380 and/or the combination of control logic 391 and data buffer 397 that make up the interface between memory device 390 and memory bus 380. In effect, memory controller 370 coordinates accesses made to memory cells within memory device 390 in answer to read and write commands from external devices. In support of these functions in various embodiments, memory controller 370 also coordinates various maintenance operations that must be performed to ensure that data stored within memory device 390 is preserved, including the initiation of regular refresh operations and/or the occurrence of precharge operations between accesses.

Memory bus 380 is made up of various control, address and data signal lines coupling together memory controller 370 and memory device 390. The exact quantity and characteristics of the various signal lines making up various possible embodiments of memory bus 380 may be configured to be interoperable with any of a number of possible memory interfaces, including those meant to be compatible with known types of memory devices, among them being DRAM devices such as FPM (fast page mode) memory devices, EDO (extended data out), dual-port VRAM (video RAM), WRAM (window RAM), SDR (single data rate) DRAM, DDR (double data rate) DRAM, RAMBUS™ DRAM, etc. In some embodiments, where activity on various signal lines is meant to be coordinated with a clock signal, one or more of the signal lines, perhaps the control signal lines, serves to transmit a clock signal between memory controller 370 and memory device 390. In some embodiments, one or more control signals and address signals may be multiplexed onto common signal lines such that control signals and address signals are transmitted at different times on common conductors for carrying signals between memory controller 370 and memory device 390. Also, in some embodiments, one or more address signals and data signals may be multiplexed onto common signal lines. In still other embodiments, addresses, commands and/or data may be transmitted in packets.

In various embodiments, memory device 390 is a DRAM memory device with an interface made up of control logic 391 and data buffer 397 configured to be interoperable with memory bus 380. In some embodiments, memory device 390 is a single integrated circuit. In other embodiments, memory device 390 is made up of multiple integrated circuits of a removable memory module, such as a SIMM (single inline memory module), SIPP (single inline pin package), DIMM (dual inline memory module), etc.

The memory cells of memory device 390 are grouped into multiple banks, such as banks 399a–399d, with each bank being made up of multiple subarrays, as earlier described in detail with regard to FIGS. 1 and 2, with the memory cells within each subarray being organized into rows and columns. In some embodiments, control logic 391 receives at least some commands and addresses from memory controller 370 through memory bus 380, and carries out those commands through bank controllers 393a–d, column address decoder 394 and/or bank selection logic 392 to access one or more specific portions of one or more of banks 399a–399d. Generally, to gain access to a memory cell within memory device 390, the address of that memory cell is made up of three parts that are transmitted by memory controller 370 to control logic 391 of memory device 390 over memory bus 380, namely the bank, row and column of the given memory cell. At least one of bank controllers 393a–d are provided by control logic 391 with the row address and decode the row address to select the appropriate subarray and row of a corresponding one of banks 399a–d. Bank controllers 393a–d also control the isolators and/or sense amplifiers within the appropriate subarrays within each of banks 399a–d to carry out whatever form of access operation is being carried out on the appropriate row of a given subarray. In a manner not unlike what has been discussed with reference to FIGS. 1 and 2, isolators between rows of memory cells and rows of sense amplifiers are used to selectively couple the memory cells to the sense amplifiers to facilitate the transfer of data between the memory cells and sense amplifiers as part of carrying out access operations, while also being used to selectively isolate those same memory cells from those same sense amplifiers at other times so that the bit lines transferring the data from the memory cells to the isolators may be precharged without data stored by the sense amplifiers being lost. In a manner also not unlike what has been discussed with reference to FIGS. 1 and 2, other isolators between those sense amplifiers and global I/O lines leading ultimately to I/O selection multiplexer 395 to which those sense amplifiers are selectively coupled to ultimately enable the transfer of data between memory device 390 and memory controller 370. At other times, those isolators between the sense amplifiers and the global I/O lines are used to selectively isolate those sense amplifiers from those global I/O lines to avoid having data stored by sense amplifiers from one subarray being lost as sense amplifiers corresponding to another subarray engage in a transfer of data across those same global I/O lines. Bank selection logic 392 is provided by control logic 391 with the bank selection portion of the address and directs the appropriate one of bank controllers 393a–d to carry out the functions just described. Column address decoder 394 is provided by control logic 391 with the column address portion of the address indicating the appropriate column(s) to be accessed, and along with bank selection logic 393, column address decoder operates I/O selection multiplexer 395 to select the appropriate column(s). Data buffer 397 latches data being transferred between memory controller 370 and I/O selection multiplexer 395 of memory device 390 as needed in support of various data transfer timings.

In some embodiments, memory controller 370 and/or control logic 391 maintains bank status buffers 379a–d and/or 398a–d, respectively, corresponding to banks 399a–d of memory device 390, in which various types of information concerning the status of one or more rows of memory cells within each bank is stored. Specifically, each one of status buffers 379a–d and/or 398a–d stores an indication of which row in each subarray of each corresponding one of banks 399a–d has been read and cached by sense amplifiers coupled to that subarray (i.e., contents of that row copied to sense amplifiers coupled to that subarray). Although the provision of both bank status buffers 379a–d and 398a–d may be perceived as redundant, depending on various characteristics of memory bus 380, including timing, protocol, handshaking provisions, etc., it may be deemed desirable for both memory controller 370 and control logic 391 to each maintain a local indication of what rows are cached by sense amplifiers, etc. Memory controller 370 and/or control logic 391 may rely on the contents of bank status buffers 379a–d and/or 398a–d, respectively, to determine which commands and/or operations are needed to retrieve a given piece of data, including whether data from a given row in one of banks 399a–d can simply be read from where it is cached by sense amplifiers, or if additional delays must be incurred, such as delays to allow time for precharge, row activate, mini row activate, etc., before an access operation for data of a given row may take place.

In embodiments where memory controller 370 does maintain data concerning the status of open rows and cached rows within memory device 390 in some form of storage device, such as bank status buffers 379a–d, but control logic 391 does not have corresponding banks status buffers 398a–d, then memory controller 370 may transmit differing variations of read, write, row activate, and/or other commands to memory device 390 to more directly control the manner in which various operations are carried out within memory device 390 as a way to compensate for such a lack of status information being maintained within memory device 390. For example, there may be different versions of read command transmitted by memory controller 370 to instruct memory device 390 to read data of a given row from sense amplifiers instead of from the memory cells of the given row, directly, since memory device 390 would lack status information needed to determine that the data for the given row may be available for quicker access from sense amplifiers. As another example, there may be different versions of row access command transmitted by memory controller 370 to instruct memory device 390 to simply change the setting of a row address decoder such that data in specific sense amplifiers corresponding to a given row becomes accessible for a reading and/or writing, instead of actually activating the actual memory cells of the given row to make those memory cells accessible for reading and/or writing. Furthermore, if control logic 391 also does not maintain information pertaining to the contents of sense amplifiers being dirty or not, then there may be different versions of write command transmitted by memory controller 370 to instruct memory device 390 to write data only to sense amplifiers within one of banks 399a–d and not to memory cells of a row coupled to those sense amplifiers. There may also be an explicit writeback command transmitted by memory controller 370 to directly control when writeback operations occur to copy dirty contents of sense amplifiers to memory cells of a row.

As an example of carrying out a read operation to retrieve data from a row within bank 399a in various embodiments, memory controller 370 may check the contents of bank status buffer 379a for information pertaining to bank 399a to determine if a given row to be read in bank 399a is already the open row within bank 399a, and whether or not the data of that row is still cached within the sense amplifiers coupled to the subarray within bank 399a of which that row is a part. If the given row is indeed the open row for bank 399a, and the data from the given row is indeed cached within those sense amplifiers, then memory controller 370 may only need to transmit a read command to memory device 390 across memory bus 380 to retrieve the data from those sense amplifiers. In some embodiments, such a read command may be a "mini read" command with overall shorter timings than would be possible with a more conventional read command in which data is retrieved from a row of memory cells, directly, to take advantage of the comparatively shorter amount of time needed to read from those sense amplifiers. In embodiments where memory controller 370 transmits a read command without a preceding precharge or row activate command upon determining that the given row is already open and still cached by sense amplifiers, control logic 391 may check the contents of bank status buffer 398a to also determine if the given row is the open row within bank 399a and is still cached by sense amplifiers. If control logic 391 determines that the given row is the open row and is cached, then control logic 391 may accept receiving only a read command and read the data of the given row directly from the sense amplifiers in which the data has been cached, instead of reading the data directly from the memory cells of the given row, directly, and memory device 390 would be able to supply that data to memory controller 370 more quickly, as a result, perhaps conforming to the shorter timings of a mini read command.

However, if the given row to be read from bank 399a is not the open row for bank 399a, but the data from the given row is still cached within the sense amplifiers coupled to the subarray of which the given row is a part, then in some embodiments, memory controller 370 may further check the contents of bank status buffer 379a to determine whether another row within bank 399a is the open row for bank 399a. In such embodiments, if another row is found to be the open row for bank 399a, then memory controller 370 may transmit a precharge command to close that row, before transmitting a row activate command to open the given row. Alternatively, in other embodiments, the fact that the data of the given row is already cached within those sense amplifiers may result in no check being made as to whether or not another row within bank 399a is open, because the fact of the data of the given row being cached in those sense amplifiers is seen to obviate the need to carry out a precharge command to close another row that might be open. In such other embodiments, memory controller 370 may transmit a row activate command to open the given row without transmitting a precharge command, regardless of whether another row within bank 399a is open, or not. Whether or not a precharge command is transmitted to close another row that may be open or not, after transmitting the row activate command to open the given row, memory controller 370 transmits a read command to memory device 390 to retrieve the data needed from those sense amplifiers. In some embodiments, the row activate command preceding this read command might be a "mini row activate" command where less time is required to pass between the transmission of this row activate command and the read command that retrieves the needed data from those sense amplifiers than would be required to were the needed data being retrieved from the memory cells of the given row, directly. In embodiments where memory controller 370 transmits a row activate command followed by a read command without a preceding precharge command upon determining that the given row is still cached by sense amplifiers though it is not the open row within bank 399a, control logic 391 may check the contents of bank status buffer 398a to also determine if the given row is the open row within bank 399a, whether it is still cached by sense amplifiers and/or whether or not another row within bank 399a is the open row. If control logic 391 determines that the given row is cached, but is not the open row, then control logic 391 may accept receiving a row activate command to open the given row without a preceding precharge command and take advantage of the data of the given row being cached by altering the setting of a row address decoder to enable access to the sense amplifiers caching that data, perhaps conforming to the shorter timings of a mini row activate command. Control logic 391 may then accept the read command and read the data of the given row directly from those sense amplifiers, instead of reading the data directly from the memory cells of the given row.

Alternatively, if the data from the given row is not cached within the sense amplifiers coupled to the subarray of which the given row is a part, then in some embodiments, memory controller 370 may further check the contents of bank status buffer 379a to determine whether a row within bank 399a other than the given row is the open row for bank 399a. In such embodiments, if another row is found to be the open row for bank 399*a*, then memory controller may transmit a precharge command to close that row. Alternatively, whether or not a precharge is command is transmitted may depend on whether or not the other row that is found to be the open row for bank 399*a* is within a subarray that uses the same sense amplifiers as would have to be used in reading the data from the given row. If such a conflict over the use of sense amplifiers by an open row and the given row were found to exist, a precharge command to close the open row would be required to close the open row and make those sense amplifiers available. Whether or not a precharge command is needed and/or transmitted in these various embodiments, reading the data stored in the given row would require memory controller 370 to transmit a row activate command to open the given row in bank 399*a*. After the transmission of that row activate command and the passage of a sufficient period of time for the memory cells of the given row to be made ready for reading, memory controller 370 would transmit a read command causing the memory cells of the given row to discharge the charges stored within those memory cells onto bit lines coupling those memory cells to isolators that further couple those bit lines to sense amplifiers where the discharged charges from the given row are latched such that the data stored within the memory cells of the given row is transferred to the sense amplifiers while the data is also by memory device 390 to memory controller 370 in response to the read command. Where a row other than the given row is open, and control logic 391 receives the row activate command without a preceding precharge command from memory controller 370, control logic 391 may check the contents of banks status buffer 398*a* to determine whether or not the currently open row and the given row for which the row activate command has been received share the same sense amplifiers. If this check reveals no such conflict between these two rows, then control logic 391 may accept the row activate command without a preceding precharge command, and may use status information within bank status buffer 398*a* indicating that the given row to be activated is not currently cached to determine that the actual memory cells of the given row must be prepared to be accessed in response to the row activate command. Similarly, control logic 39*a* may then use the same status information indicating that the data within the given row is still not cached to determine that the subsequent read operation for that row must be responded to by obtaining the data directly from the memory cells of the given row, as described.

In various embodiments, memory controller 370 may carry out various operations, including precharge operations on rows within one or more of banks 399*a–d* between other operations to access data. In various embodiments, memory controller 370 may employ one or more page closing algorithms that attempt to predict occasions in which a row should be preemptively closed in anticipation of data needing to be read from other rows. Regardless of the reason for the closing of a specific row, the provision of isolators between memory cells and the inputs of rows of sense amplifiers (as discussed at considerable length, above) makes possible the carrying out of precharge operations affecting bit lines that transmit data between memory cells and amplifiers while isolating those sense amplifiers such that data stored within those sense amplifiers is not lost as a result of the precharge operation, and thereby aiding in allowing such rows of sense amplifiers to act as a cache of an entire row of memory cells. Indeed, this preservation of data within rows of sense amplifiers may well enable memory controller 370 to employ a page closing algorithm in which each row is immediately closed with a precharge operation after its data is latched in a row of sense amplifiers. Where read operations are concerned, this would result in every read operation to retrieve data from a row that does not already have its data stored in a row of sense amplifiers (what might be called a "cache miss") to result in a page empty condition where there the delay of awaiting a precharge operation to be carried out need not be incurred before transmitting a row activate command to open another row for access. Were such a policy of closing every row after reading (and perhaps, also after writing) the row is to be employed, then in such embodiments, a read with auto precharge command and/or a write with auto precharge command may be employed to gain the advantages of combining the otherwise separate read (or write) and precharge commands into a single command. Regardless of whether the precharging of rows to close them subsequent to accessing them occurs as a result of a prediction algorithm or other less sophisticated algorithms, the ability to carry out precharge operations on some rows within banks 399*a–d* of memory device 390 without loss of data in sense amplifiers used to cache data from other rows provides the opportunity to carry out at least some of such precharge operations in the background with little or no delays incurred in carrying out other operations.

As an example of carrying out a write operation to store data into a given row within bank 399*a* in various embodiments, memory controller 370 may check the contents of bank status buffer 379*a* for information pertaining to bank 399*a* to determine if the given row to be written is already the open row within bank 399*a*, and whether or not the data currently in that row is still cached within the sense amplifiers coupled to the subarray within bank 399*a* of which that row is a part. If the given row is indeed the open row for bank 399*a*, and the current data from the given row is indeed cached within those sense amplifiers, then memory controller 370 may only need to transmit a write command to memory device 390 across memory bus 380 to store data into those sense amplifiers. In some embodiments, such a write command may be a "mini write" command with overall shorter timings than would be possible with a more conventional write command by which data is written into memory cells (either in addition to or instead of being written into sense amplifiers), to take advantage of the comparatively shorter amount of time needed to write data into those sense amplifiers. However, writing the data into those sense amplifiers, only would result in the data stored in those sense amplifiers becoming more up to date than the data in those memory cells, further resulting in the need to subsequently carry out a writeback operation to copy the updated data from those sense amplifiers and into those memory cells, and this may necessitate the keeping of status information within bank status buffer 379*a* concerning the dirty status of the contents of those sense amplifiers. In such embodiments where memory controller 370 transmits a write command without a preceding precharge or row activate command upon determining (by checking bank status buffer 379*a*) that the given row is already open and still cached by sense amplifiers, control logic 391 may check the contents of bank status buffer 398*a* to also determine if the given row is the open row within bank 399*a* and is still cached by sense amplifiers. If control logic 391 also determines (as did memory controller 370) that the given row is the open row and is cached, then control logic 391 may accept receiving only a write command and write the data of the given row solely to the sense amplifiers in which the data has been cached, instead of also writing the data to the memory cells of the given row, and memory device 390 would be able to complete the write operation more quickly, though control logic 391 may also record the resulting dirty status of the contents of those sense amplifiers in banks status buffer 398*a*, in preparation for the carrying out of a subsequent writeback operation.

Alternatively, if the given row to be written to in bank 399*a* is not the open row for bank 399*a* (the given row may have already been closed through a precharge operation), but the current data from the given row is still cached within the sense amplifiers coupled to the subarray of which the given row is a part, then in some embodiments, memory controller 370 may further check the contents of bank status buffer 379*a* to determine whether another row within bank 399*a* is the open row for bank 399*a*. In such embodiments, if another row is found to be the open row for bank 399*a*, then memory controller 370 may transmit a precharge command to close that row, before transmitting a row activate command to open the given row. Alternatively, in other embodiments, the fact that the data of the given row is already cached within those sense amplifiers may result in no check being made as to whether or not another row within bank 399*a* is open, because the fact of the data of the given row being cached in those sense amplifiers is seen to obviate the need to carry out a precharge command to close another row that might be open. In such other embodiments, memory controller 370 may transmit a row activate command without first transmitting a precharge command, regardless of whether another row within bank 399*a* is open, or not. Regardless of whether or not a precharge command is transmitted to close another row, after transmitting the row activate command to open the given row, memory controller 370 transmits a write command to memory device 390 to store the data being written into at least those sense amplifiers. In some embodiments, the row activate and write commands may be a "mini row activate" and a "mini write" command to simply make those sense amplifiers available for storing data and then to store the data of the write operation into those sense amplifiers in less time than would be required to both carry out a row activate command that would actually ready the memory cells of the given row to be written and a write command that would actually write the data of the write operation into those memory cells. Also, in these embodiments where memory controller 370 transmits a row activate command followed by a write command without a preceding precharge command upon determining that the given row is still cached by sense amplifiers though it is not the open row within bank 399*a*, control logic 391 may check the contents of bank status buffer 398*a* to also determine if the given row is the open row within bank 399*a*, whether it is still cached by sense amplifiers and/or whether or not another row within bank 399*a* is the open row. If control logic 391 determines (as did memory controller 370) that the given row is cached, but is not the open row, then control logic 391 may accept receiving a row activate command to open the given row without a preceding precharge command and take advantage of the data of the given row being cached by simply altering the setting of a row address decoder to enable access to the sense amplifiers caching that data, perhaps conforming to the shorter timings of a mini row activate command. Control logic 391 may then accept the write command and write the data solely into those sense amplifiers, without also writing that data into the memory cells of the given row, perhaps conforming to the shorter timings of a mini write command. However, as previously noted, where a mini write command is carried out such that those sense amplifiers store data that is more up to date than the data of the given row, then information pertaining to this resulting dirty status of those sense amplifiers may be recorded in bank status buffers 379*a* and/or 398*a*.

The provision of isolators between sense amplifiers and global I/O lines used for transmitting data from those sense amplifiers to other portions of a memory device, such as I/O selection multiplexer 395 of memory device 390, affords greater flexibility in the operation of such a memory device. Specifically, the need to rigidly adhere to the requirement of always closing any open row within a bank before opening another row found in other DRAM memory devices can be frequently ignored in the operation of memory device 390. As long as a new row to be accessed does not share the same sense amplifiers in a block of one or more subarrays as another row that is already open, the new row may be opened without incurring the delay of waiting for the transmission and carrying out of a precharge command to take place. In essence, multiple rows within a bank (up to 1 row for every block of one or more subarrays within a bank) could actually be opened without having to subsequently be closed to enable the reading data from another row. To switch between reading one such open row to reading another such open row would require little more than the transmission of a "mini row activate" command (as earlier described) to do little more than to transmit the row address of the new row to be read with the next transmitted read command.

Figure 4:
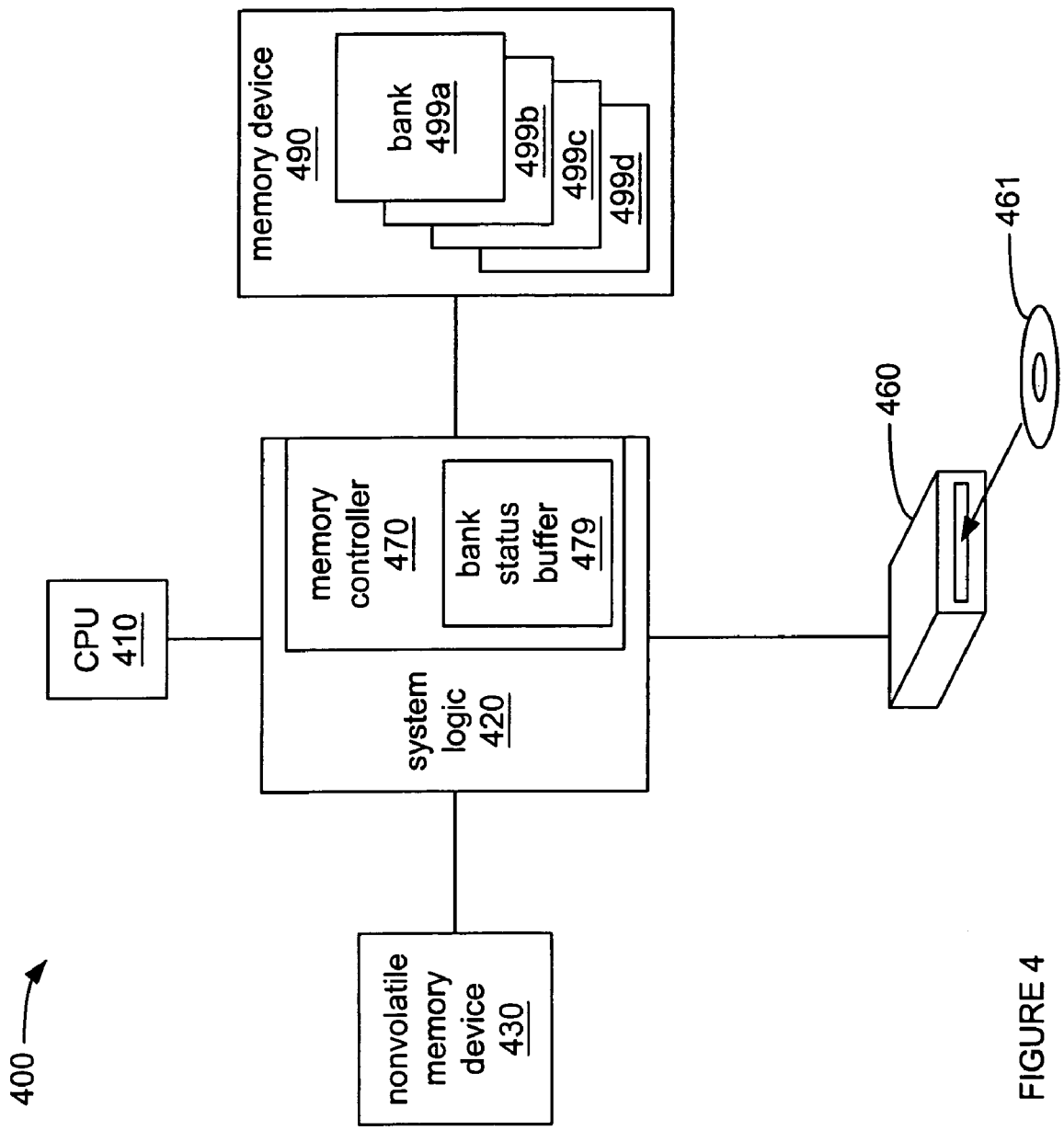
FIG. 4 is a block diagram of an embodiment employing a computer system.

FIG. 4 is a simplified block diagram of an embodiment employing a computer system. Computer system 400 is, at least in part, made up of CPU (central processing unit) 410, system logic 420, and memory device 490. System logic 420 is coupled to CPU 410 and performs various functions in support of CPU 410 including providing CPU 410 with access to memory device 490 to which system logic 420 is also coupled, using memory controller 470 within system logic 420. CPU 410, system logic 420 and memory device 490 make up a form of core for computer system 400 that is capable of supporting the execution of machine readable instructions by CPU 410 and the storage of data and instructions within memory device 490.

In various embodiments, CPU 410 could be any of a variety of types of CPU including a CPU capable of executing at least a portion of the widely known and used "x86" instruction set, and in other various embodiments, there could be more than one CPU. In various embodiments, memory device 490 could be any of a variety of types of dynamic random access memory (RAM) including fast page mode (FPM), extended data out (EDO), single data rate (SDR) or double data rate (DDR) forms of synchronous dynamic RAM (SDRAM), RAM of various technologies employing a RAMBUS™ interface, etc., and memory controller 470 provides logic 420 with an appropriate interface for the type of memory. At least a portion of the memory cells of memory device 490 are divided into banks 499*a–d*, each of which are made up of memory cells organized into rows and columns in a two dimensional memory array. To access a portion of the memory cells within memory device 490, that portion must be addressed by memory controller 470 with a combination of bank, row and column addresses. As those skilled in the art will recognize, the depiction of a single memory device 490 with four banks of memory cells, namely banks 499*a–499d*, is but an example of a memory system that could be a part of a computer system, and that a larger number of memory devices and/or a differing number of banks within memory devices could be used without departing from the spirit and scope of the present invention as hereinafter claimed.

In some embodiments, system logic 420 is coupled to and provides CPU 410 with access to storage device 460 by which data and/or instructions carried by storage media 461 may be accessed. Storage media 461 may be of any of a wide variety of types and technologies as those skilled in the art will understand, including CD or DVD ROM, magnetic or optical diskette, magneto-optical disk, tape, semiconductor memory, characters or perforations on paper or other material, etc. In some embodiments, nonvolatile memory device 430 is coupled to system logic 420 (or other part of computer system 400) and provides storage for an initial series of instructions executed at a time when computer system 400 is either "reset" or initialized (for example, when computer system 400 is "turned on" or "powered up") to perform tasks needed to prepare computer system 400 for normal use. In some variations of such embodiments, upon initialization or resetting of computer system 400, CPU 410 accesses nonvolatile memory device 430 to retrieve instructions to be executed to prepare memory controller 470 for normal use in providing access for CPU 410 to memory device 490. It may be that these same retrieved instructions are executed to prepare system logic 420 for normal use in providing access to storage device 460 and whatever form of storage media 461 that may be used by storage device 460.

In some embodiments, storage media 461 carries machine-accessible instructions to be executed by CPU 410 to cause CPU 410 to carry out one or more tests of memory device 490 to determine what type of DRAM device memory device 490 may be, and/or to determine what functions memory device 490 may support. Such tests may include a series of attempted accesses to portions of memory device 490 and observation of the nature of the responses, received. Alternatively, such tests may include interrogating a code identifying the type of memory device or identifying the presence of one or more features, or such tests may entail reading data stored in a portion of nonvolatile memory within memory device 490 identifying the type of memory device, various parameters, and/or the presence or absence of various features. If it is determined that memory device 490 is able to support the use of sense amplifiers as a form of cache and/or that memory device 490 is able to support having dirty contents within sense amplifiers employed as a form of cache (as described at length elsewhere herein), then CPU 410 may be caused to program or otherwise configure memory controller 470 to make use of such a caching capability. In embodiments where memory controller 470 is so programmed, memory controller 470 may have access to or incorporate a storage device such as bank status buffer 479 in which to maintain data concerning the status of various rows within the subarrays making up each of banks 499a–d of memory device 490. Such data, whether stored in a specific buffer such as bank status buffer 479, or not, may provide an indication of which of rows within each of banks 499a–d are cached by a row of sense amplifiers coupled to the subarrays in which each of those rows reside. Memory controller 470 may access such data to determine whether or not a row to be accessed in a given one of banks 499a–d is cached by a row of sense amplifiers, whether or not the contents of that row of sense amplifiers is dirty, whether or not a row to be accessed is already open, and/or whether or not a different row is open within each bank.

As earlier discussed, if a row to be accessed is determined to be cached and already open, then the data in the sense amplifiers serving as a cache may be read from or written to with the transmission of only a read command (or mini read command) or only a write command (or mini write command), and with or without auto precharge. However, if the row to be accessed is determined to be cached, but not already be open, then the data in the sense amplifiers serving as a cache may be read from or written to with the transmission of both a row activate command (perhaps a mini row activate command) and a read or write command (perhaps a mini read or write command either with or without auto precharge). In such an instance, the transmission of the row activate command may be preceded with the transmission of a precharge command to close another row, if there is another row that is found to be open. Alternatively, if a row to be accessed is determined to not be cached by a row sense amplifiers, then the data in the memory cells of the row, itself, may be read from or written to with the transmission of a row activate command followed by waiting for the appropriate time for the row activation to be completed and then the transmission of a read or write command causing the data within the memory cells of the row to be copied to a row of sense amplifiers from which the data would then be read or to which the data would then be written.

Figure 5:
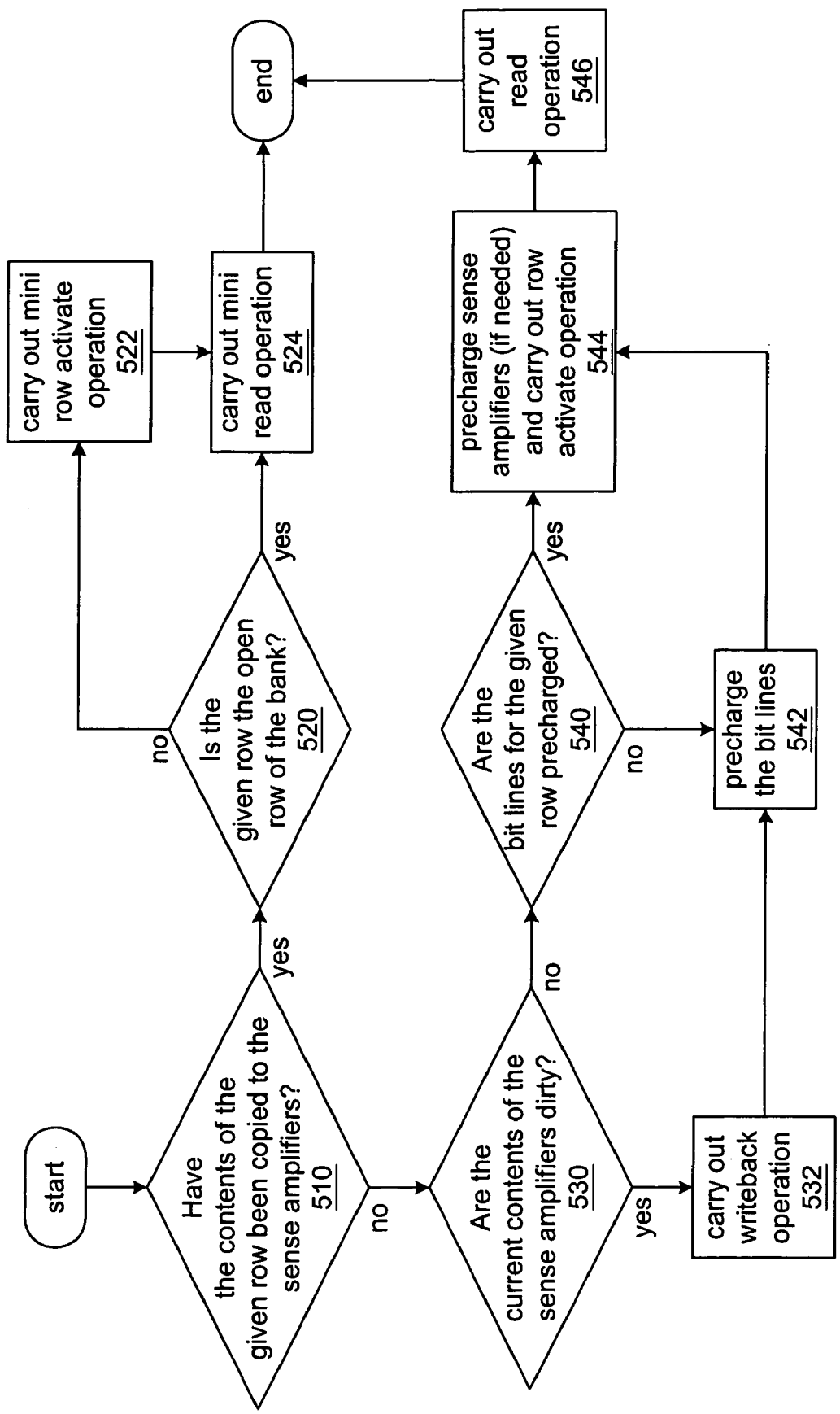
FIG. 5 is a flow chart of an embodiment.

FIG. 5 is a flow chart of embodiments of operations to read data from a given row within a given bank of a memory device. At 510, a determination is made as to whether the contents of the given row have already been copied to corresponding sense amplifiers within the given bank. In some embodiments, this determination is made by a memory controller checking stored information pertaining to which rows of which subarrays or blocks of memory have been copied into sense amplifiers, which row is open in each bank, and/or whether or not the contents copied from various rows into sense amplifiers are dirty. In other embodiments, this determination might later also be made by logic within the memory device that also checks such stored information as commands are received to possibly determine which course of action should be taken to enable various operations to be completed in less time. If the contents of the given row have already been copied into sense amplifiers, then at 520, a determination is made as to whether or not the given row is the open row within the given bank. If the given row is the open row of the given bank, then a mini read operation in which isolators between the sense amplifiers storing the contents of the given row and global I/O lines are operated to couple those sense amplifiers to those global I/O lines to enable data to be read out of those sense amplifiers within a period of time shorter than would be possible if the data were read out of the memory cells of the given row, itself. However, if the given row is not the open row of the given bank, then a mini row activate command is carried out at 522 to change the setting of a row address decoder of the given bank to make the sense amplifiers storing the contents of the given row accessible for being read at 524 with a mini read command, as just described. In some embodiments, the mini row activate and mini read commands may be separate and distinct commands transmitted by a memory controller to signal variants of row activate and read commands that require less time to carry out, while in alternative embodiments, logic within the memory device autonomously checks stored information pertaining to the status of the given row within the given bank to determine whether or not a mini row activate or mini read command may be carried out in lieu of another form of row activate or read command.

Alternatively, if the contents of the given row are determined at 510 to have not been copied into sense amplifiers, then at 530, a determination is made as to whether the current contents of the sense amplifiers corresponding to the given row are dirty or not. If the contents of those corresponding sense amplifiers are not dirty, then at 540, a determination is made as to whether or not the bit lines coupled to the memory cells of the given row are already precharged or not. If those bit lines have already been precharged, then a possible precharging of the sense amplifiers to prepare the sense amplifiers to receive data from the given row (if the sense amplifiers require such preparation) and a row activation operation to prepare the memory cells of the given row to be accessed are carried out at 544. If those bit lines have not already been precharged, then a precharge operation is carried out to precharge those bit lines at 542, before the possible precharging of the sense amplifiers and the row activate operation are carried out at 544. However, if the contents of the corresponding sense amplifiers are determined to be dirty at 530, then a writeback operation is carried out at 532 to copy the dirty contents of those sense amplifiers to the row to which the dirty contents belong, just before those same bit lines are precharged at 542, and both the possible sense amplifier precharging and the row activation operation take place at 544. In this writeback operation, isolators between the sense amplifiers and bit lines coupled to the row to which the dirty contents belong (these may be the same bit lines as are coupled to the memory cells of the given row) are operated to couple together those sense amplifiers and those bit lines such that the dirty contents may be transmitted by the sense amplifiers to the memory cells of the row to which the dirty contents belong and latched by the memory cells of that row when the corresponding word line is operated to cause latching to occur. In some embodiments, a writeback operation may be initiated by a command transmitted by a memory controller, while in alternative embodiments, a writeback operation may be brought about autonomously by logic within the memory device as a result of receiving a row activate command that would entail using sense amplifiers that currently store dirty contents. After the possible precharge of the sense amplifiers and activation of the given row at 544, the read operation is carried out at 546.

Figure 6:
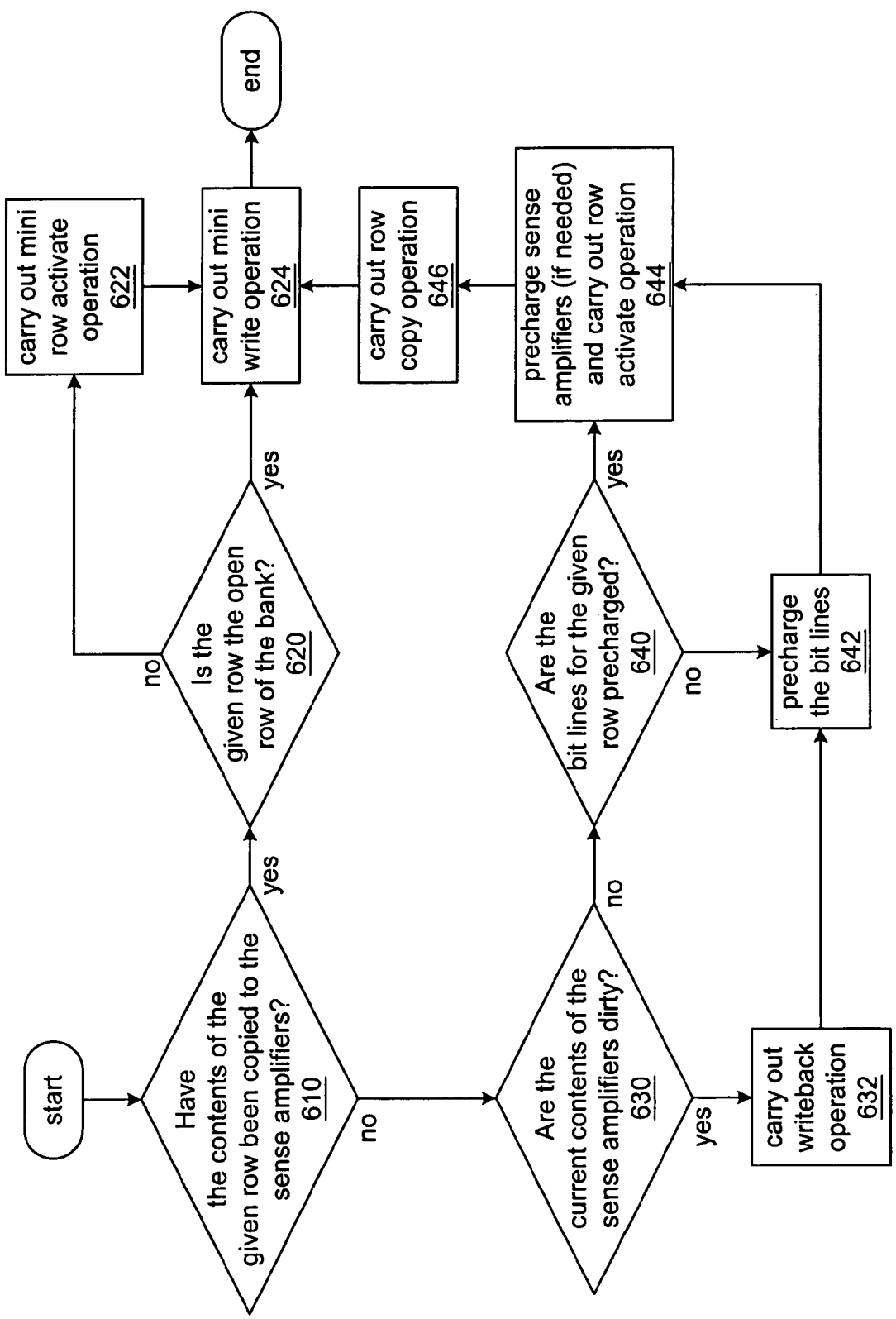
FIG. 6 is a flow chart of another embodiment.

FIG. 6 is a flow chart of embodiments of operations to write data to a given row within a given bank of a memory device. At 610, a determination is made as to whether the contents of the given row have already been copied to corresponding sense amplifiers within the given bank. In some embodiments, this determination is made by a memory controller checking stored information pertaining to which rows of which subarrays or blocks of memory have been copied into sense amplifiers, which row is open in each bank, and/or whether or not the contents copied from various rows into sense amplifiers are dirty. In other embodiments, this determination might later also be made by logic within the memory device that also checks such stored information as commands are received to possibly determine which course of action should be taken to enable various operations to be completed in less time. If the contents of the given row have already been copied into sense amplifiers, then at 620, a determination is made as to whether or not the given row is the open row within the given bank. If the given row is the open row of the given bank, then a mini write operation in which isolators between the sense amplifiers storing the contents of the given row and global I/O lines are operated to couple those sense amplifiers to those global I/O lines to enable data to be written solely into those sense amplifiers within a period of time shorter than would be possible if the data were also written into the memory cells of the given row, itself. Information is also stored at 624 indicating that those sense amplifiers now have contents that are dirty since those contents are now more up to date than the contents of the memory cells of the given row, itself, and in various embodiments, this dirty status information is maintained within the memory device and/or within a memory controller operating the memory device. However, if the given row is not the open row of the given bank, then a mini row activate command is carried out at 622 to change the setting of a row address decoder of the given bank to make the sense amplifiers storing the contents of the given row accessible for being written to at 624 with a mini write command, as just described. In some embodiments, the mini row activate and mini write commands may be separate and distinct commands transmitted by a memory controller to signal variants of row activate and write commands that require less time to carry out, while in alternative embodiments, logic within the memory device autonomously checks stored information pertaining to the status of the given row within the given bank to determine whether or not a mini row activate or mini write command may be carried out in lieu of another form of row activate or write command.

Alternatively, if the contents of the given row are determined at 610 to have not been copied into sense amplifiers, then at 630, a determination is made as to whether the current contents of the sense amplifiers corresponding to the given row are dirty or not. If the contents of those corresponding sense amplifiers are not dirty, then at 640, a determination is made as to whether or not the bit lines coupled to the memory cells of the given row are already precharged or not. If those bit lines have already been precharged, then both a possible precharge of the sense amplifiers to prepare the sense amplifiers to receive data from the given row (if the sense amplifiers need such preparation) and a row activation operation to prepare the memory cells of the given row to be accessed are carried out at 644. If those bit lines have not already been precharged, then a precharge operation is carried out to precharge those bit lines at 642, before both the possible sense amplifier precharging and the row activate operation at 644 are carried out. However, if the contents of the corresponding sense amplifiers are determined to be dirty at 630, then a writeback operation is carried out at 632 to copy the dirty contents of those sense amplifiers to the row to which those contents belong, possibly using those bit lines coupled to the memory cells of the given row, just before those same bit lines are precharged at 642 and both the possible sense amplifier precharging and the row activation operation take place at 644. In some embodiments, a writeback operation may be initiated by a command transmitted by a memory controller, while in alternative embodiments, a writeback operation may be brought about autonomously by logic within the memory device as a result of receiving a row activate command that would entail using sense amplifiers that currently store dirty contents. After possible sense amplifier precharging and activation of the given row at 644, a row copy operation is carried out at 646 whereby isolators between the bit lines coupled to the memory cells of the given row and those sense amplifiers to allow the contents of the memory cells to be copied across those bit lines and into those sense amplifiers when the word line corresponding to the given row within the given bank is operated to cause the memory cells of the given row to discharge their contents on to those bit lines. With the contents of the given row now contained within the sense amplifiers, the mini write operation at 624, as earlier described, takes place.

What is claimed is:

1. A memory device comprising:
   a first subarray of memory cells organized into rows and columns;
   a first plurality of bit lines, each coupled to a column of memory cells;
   a first set of subarray isolators to selectively couple the first plurality of bit lines to a first row of sense amplifiers;
   a first set of common isolators to selectively couple the first row of sense amplifiers to a plurality of global I/O lines; and
   isolator control logic to coordinate the operation of the first set of common isolators to allow data received from outside the memory device and present on the plurality of global I/O lines to be latched by the first row of sense amplifiers, to store an indication that the data latched by the first row of sense amplifiers is dirty, to coordinate the operation of the first set of subarray isolators to allow data latched by the first row of sense amplifiers to be written back to a row of memory cells within the first subarray, and to remove an indication that the data latched by the first row of sense amplifiers is dirty.

2. The memory device of claim 1, further comprising:
   a second subarray of memory cells organized into rows and columns;
   a second plurality of bit lines, each one of the second plurality of bit lines being coupled to a column of memory cells;
   a second set of subarray isolators to selectively couple the second plurality of bit lines to a second row of sense amplifiers, wherein the second set of subarray isolators are operable by the isolator control logic to allow data latched in the second row of sense amplifiers to be written back to a row within the second subarray by allowing the second row of sense amplifiers to transmit data through both the second set of subarray isolators and the second plurality of bit lines and to the row within the second subarray when there is an indication that the data latched in the second row of sense amplifiers is dirty; and
   a second set of common isolators to selectively couple the second row of sense amplifiers to the plurality of global I/O lines, wherein the second set of common isolators is operable by the isolator control logic to allow data received from outside the memory device and present on the plurality of global I/O lines to be latched by the second row of sense amplifiers, and wherein the isolator logic stores an indication that the data latched by the second row of sense amplifiers is dirty.

3. The memory device of claim 1, further comprising:
   a first bank of memory comprised of the first and second subarrays, the first and second set of subarray isolators, the first and second set of sense amplifiers, and the first and second sets of common isolators; and
   a second bank of memory.

4. The memory device of claim 1, further comprising control logic configured to receive a mini write command and to respond by operating at least the first set of common isolators to cause data to be copied from the global I/O lines and through the first set of common isolators to the first row of sense amplifiers where the data is latched, and storing an indication that the data latched in the first row of sense amplifiers is dirty.

5. The memory device of claim 4, wherein the control logic is further configured to receive a writeback command and to respond by operating at least the first set of subarray isolators and a row of memory cells within the first subarray to cause data latched by the first row of sense amplifiers to be copied from the first row of sense amplifiers, through both the first set of subarray isolators and the first plurality of bit lines, and the row of memory cells.

6. The memory device of claim 1, wherein the control logic is further configured to receive a mini row activate command wherein a row address identifying a row within the first subarray is received by the control logic to signal that data latched within the first row of sense amplifiers from the row within the first subarray is to be transmitted through the first set of common isolators to the plurality of global I/O lines upon receipt of a read command.

7. A controlling device comprising:
   a first storage location in which data concerning the status of both rows of memory cells and rows of sense amplifiers within a bank of memory cells within a memory device is stored;
   control logic coupled to the first storage location to check data within the first storage location to determine if the contents of a specific row of sense amplifiers is dirty; and
   a memory bus coupling the control logic to the memory device to allow commands to be transmitted from the control logic to the memory device,
   wherein the control logic transmits a mini write command to the memory device to cause data transmitted to the memory device to be latched by the specific row of sense amplifiers, if the current contents of the specific row of memory cells has been copied to the specific row of sense amplifiers and the specific row of memory cells is the open row within the bank.

8. A controlling device comprising:
   a first storage location in which data concerning the status of both rows of memory cells and rows of sense amplifiers within a bank of memory cells within a memory device is stored;
   control logic coupled to the first storage location to check data within the first storage location to determine if the contents of a specific row of sense amplifiers is dirty; and a memory bus coupling the control logic to the memory device to allow commands to be transmitted from the control logic to the memory device,
   wherein the control logic transmits a mini row activate command and a mini write command to the memory device to cause the specific row of memory cells to become the open row within the bank and to cause data transmitted to the memory device to be latched by the specific row of sense amplifiers, if the current contents of the specific row of memory cells has been copied to the specific row of sense amplifiers and the specific row of memory cells is not the open row within the bank.

9. A controlling device comprising:
   a first storage location in which data concerning the status of both rows of memory cells and rows of sense amplifiers within a bank of memory cells within a memory device is stored;
   control logic coupled to the first storage location to check data within the first storage location to determine if the contents of a specific row of sense amplifiers is dirty; and a memory bus coupling the control logic to the memory device to allow commands to be transmitted from the control logic to the memory device,
   wherein the control logic transmits a row activate command and a write command to the memory device to cause the specific row of memory cells to become the open row within the bank, to cause the data in the specific row of memory cells to be copied to the specific row of sense amplifiers, and to cause the data transmitted to the memory device to be latched by the specific row of sense amplifiers, if the current contents of the specific row of memory cells have not been copied to the specific row of sense amplifiers and the current contents of the specific row of sense amplifiers are not dirty.

10. A controlling device comprising:
a first storage location in which data concerning the status of both rows of memory cells and rows of sense amplifiers within a bank of memory cells within a memory device is stored;
control logic coupled to the first storage location to check data within the first storage location to determine if the contents of a specific row of sense amplifiers is dirty; and a memory bus coupling the control logic to the memory device to allow commands to be transmitted from the control logic to the memory device,
wherein the control logic transmits a writeback command, a row activate command and a write command to the memory device to cause the specific row of sense amplifiers to writeback the data currently latched within the specific row of sense amplifiers to the other row to which that data corresponds, to cause the specific row of memory cells to become the open row within the bank, to cause the data in the specific row of memory cells to be copied to the specific row of sense amplifiers, and to cause the data transmitted to the memory device to be latched by the specific row of sense amplifiers, if the current contents of the specific row of memory cells have not been copied to the specific row of sense amplifiers and the current contents of the specific row of sense amplifiers are dirty.

11. A computer system comprising:
a processor;
a memory device having at least one bank in which a plurality of memory cells are organized into rows;
a memory controller coupled to the processor and having a first storage location that the memory controller accesses to determine if the contents of a specific row to which data is to be written in response to a request from the processor to write data is already cached by a specific row of sense amplifiers, to check if the specific row is the open row within the bank, and to check if the data cached by the specific row of sense amplifiers is dirty; and
a memory bus coupling the control logic to the memory device to allow commands to be transmitted from the control logic to the memory device,
wherein the memory controller transmits a mini row activate command and a mini write command to the memory device to cause the specific row of memory cells to become the open row within the bank and to cause data transmitted to the memory device to be latched by the specific row of sense amplifiers, if the current contents of the specific row of memory cells has been copied to the specific row of sense amplifiers and the specific row of memory cells is not the open row within the bank.

12. A computer system comprising:
a processor;
a memory device having at least one bank in which a plurality of memory cells are organized into rows;
a memory controller coupled to the processor and having a first storage location that the memory controller accesses to determine if the contents of a specific row to which data is to be written in response to a request from the processor to write data is already cached by a specific row of sense amplifiers, to check if the specific row is the open row within the bank, and to check if the data cached by the specific row of sense amplifiers is dirty; and
a memory bus coupling the control logic to the memory device to allow commands to be transmitted from the control logic to the memory device,
wherein the control logic transmits a row activate command and a write command to the memory device to cause the specific row of memory cells to become the open row within the bank, to cause the data in the specific row of memory cells to be copied to the specific row of sense amplifiers, and to cause the data transmitted to the memory device to be latched by the specific row of sense amplifiers, if the current contents of the specific row of memory cells have not been copied to the specific row of sense amplifiers and the current contents of the specific row of sense amplifiers are not dirty.

13. A computer system comprising:
a processor;
a memory device having at least one bank in which a plurality of memory cells are organized into rows;
a memory controller coupled to the processor and having a first storage location that the memory controller accesses to determine if the contents of a specific row to which data is to be written in response to a request from the processor to write data is already cached by a specific row of sense amplifiers, to check if the specific row is the open row within the bank, and to check if the data cached by the specific row of sense amplifiers is dirty; and
a memory bus coupling the control logic to the memory device to allow commands to be transmitted from the control logic to the memory device,
wherein the control logic transmits a writeback command, a row activate command and a write command to the memory device to cause the specific row of sense amplifiers to writeback the data currently latched within the specific row of sense amplifiers to the other row to which that data corresponds, to cause the specific row of memory cells to become the open row within the bank, to cause the data in the specific row of memory cells to be copied to the specific row of sense amplifiers, and to cause the data transmitted to the memory device to be latched by the specific row of sense amplifiers, if the current contents of the specific row of memory cells have not been copied to the specific row of sense amplifiers and the current contents of the specific row of sense amplifiers are dirty.

14. A method comprising:
determining whether or not the contents of a specific row of memory cells within a subarray of memory cells organized into multiple rows and columns are already cached within a specific row of sense amplifiers;
determining whether or not the specific row of memory cells is the open row of a bank of a memory device in which the subarray is located;
determining whether or not the data currently cached in the specific row of sense amplifiers is dirty;
transmitting data to the memory device;
transmitting a mini write command to the memory device to write the data transmitted to the memory device to at least a portion of the specific row of sense amplifiers if the contents of the specific row of memory cells have been copied to the specific row of sense amplifiers, the specific row of memory cells is the open row of the bank of the memory device.

15. The method of claim 14, further comprising transmitting a mini row activate command to the memory device to cause the specific row of memory cells to become the open row of the banks of the memory device if the contents of the specific row of memory cells have been copied to the specific row of sense amplifiers, but the specific row of memory cells is not the open row of the bank of the memory device.

16. The method of claim 14, further comprising:
transmitting a writeback command to the memory device to cause a set of subarray isolators to permit the current contents of the specific row of sense amplifiers to be written back to the other row of memory cells to which those contents correspond, if the contents of the specific row are not cached in the specific row of sense amplifiers and the current contents of the specific row of sense amplifiers are dirty; and
transmitting a row activate command to the memory device to make the specific row the open row of the bank of the memory device, if the contents of the specific row are not cached in the specific row of sense amplifiers.

17. A method comprising:
operating a first set of isolators coupled to a first row of sense amplifiers in response to the receipt of a mini write command to allow data received on a set of global I/O coupled to the input of a memory device of which the first row of sense amplifiers are a part to be copied into and latched by the first row of sense amplifiers;
storing an indication that the data latched by the first row of sense amplifiers is dirty; and
operating a second set of isolators coupled between a first set of bit lines and the first row of sense amplifiers in response to the receipt of a writeback command to allow the data latched by the first row of sense amplifier to be copied to and stored in a first row of memory cells also coupled to the first set of bit lines.

18. The method of claim 17, further comprising operating the first set of isolators to isolate the first row of sense amplifiers from the set of global I/O lines while allowing data received on the set of global I/O lines to be copied into and latched by a second row of sense amplifiers without data stored within the first row of sense amplifiers being lost.

19. A machine-accessible medium comprising code that when executed by a processor within an electronic device, causes the electronic device to:
check whether or not a memory device is capable of caching the contents of a row of memory cells within a row of sense amplifiers, and whether or not the memory device is capable of responding to a writeback command;
program a memory controller to transmit a mini row activate command to activate a row of which the contents have been determined to have been cached within a row of sense amplifiers to make possible the subsequent writing of data to the row of sense amplifiers; and
program a memory controller to transmit a mini write command to write data to the row of sense amplifiers and store an indication that the data latched in the row of sense amplifiers is dirty in lieu of writing the data to the row of memory cells being cached by the row of sense amplifiers.

20. The machine-accessible medium of claim 19, further causing the electronic device to transmit a precharge command causing the row of sense amplifiers to be isolated from bit lines that otherwise couple the row of sense amplifiers to columns of memory cells within a subarray while the precharge operation to precharge the bit lines is carried out so as to prevent data cached within the row of sense amplifiers from being lost.

* * * * *